US 8,234,520 B2

(12) United States Patent
Walls et al.

(10) Patent No.: US 8,234,520 B2
(45) Date of Patent: Jul. 31, 2012

(54) WEAR LEVELING OF SOLID STATE DISKS BASED ON USAGE INFORMATION OF DATA AND PARITY RECEIVED FROM A RAID CONTROLLER

(75) Inventors: Andrew Dale Walls, San Jose, CA (US); Daniel Frank Moertl, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 54 days.

(21) Appl. No.: 12/561,210

(22) Filed: Sep. 16, 2009

(65) Prior Publication Data

US 2011/0066882 A1 Mar. 17, 2011

(51) Int. Cl.
*G06F 11/00* (2006.01)
*G06F 11/16* (2006.01)
(52) U.S. Cl. ........ 714/6.22; 714/6.2; 714/6.21; 711/114
(58) Field of Classification Search .............. 714/6, 47, 714/6.1, 6.2, 6.21, 6.22, 47.1, 47.2, 47.3; 711/114
See application file for complete search history.

(56) References Cited

U.S. PATENT DOCUMENTS

| | | | |
|---|---|---|---|
| 5,341,339 A | | 8/1994 | Wells |
| 5,490,248 A | * | 2/1996 | Dan et al. ............... 714/6.22 |
| 5,671,388 A | | 9/1997 | Hasbun |
| 5,754,756 A | * | 5/1998 | Watanabe et al. .......... 714/6.21 |
| 5,822,782 A | * | 10/1998 | Humlicek et al. .......... 711/170 |
| 5,875,459 A | * | 2/1999 | Taoda .................... 711/114 |
| 7,073,010 B2 | | 7/2006 | Chen et al. |
| 7,120,729 B2 | | 10/2006 | Gonzalez et al. |
| 7,191,207 B2 | | 3/2007 | Blount et al. |

(Continued)

FOREIGN PATENT DOCUMENTS

EP 1628218 2/2006

(Continued)

OTHER PUBLICATIONS

Nitin A, et al. "Design Tradeoffs for SSD Performance", was scheduled to appear in the Proceedings of the USENIX Technical Conference, Jun. 2008, http://research.microsoft.com/users/vijayanp/papers/ssd-usenix08.pdf.

Myers D., "On the Use of NAND Flash Memory in High-Performance Relational Databases", Master's Thesis, MIT, pp. 1-49, Feb. 2008, http://people.csail.mit.edu/dsm/flash-thesis.pdf.

Narayanan D. et al. "Migrating Enterprise Storage to SSDs: Analysis of Tradeoffs", Microsoft Research Ltd., Technical Report MSR-TR-2008-169, pp. 1-12, Nov. 2008, ftp://ftp.research.microsoft.com/pub/tr/TR-2008-169.pdf.

(Continued)

*Primary Examiner* — Joseph Schell
(74) *Attorney, Agent, or Firm* — Rabindranath Dutta; Konrad Raynes and Victor LLP

(57) ABSTRACT

A controller configures a plurality of solid state disks as a redundant array of independent disks (RAID), wherein the plurality of solid state disks store a plurality of blocks, and wherein storage areas of the plurality of solid state disks corresponding to at least some blocks of the plurality of blocks have different amounts of estimated life expectancies. The controller includes in data structures associated with a block that is to be stored in the storage areas of the plurality of solid state disks an indication that the block includes parity information corresponding to the RAID, wherein parity information comprises information corresponding to an error correction mechanism to protect against a disk failure. The controller sends the data structures to the plurality of solid state disks, wherein the plurality of solid state disks allocate a storage area that is estimated to have a relatively greater life expectancy in comparison to other storage areas to store the block that includes the parity information.

12 Claims, 9 Drawing Sheets

U.S. PATENT DOCUMENTS

| | | | |
|---|---|---|---|
| 7,328,305 B2 * | 2/2008 | Kleiman et al. | 711/114 |
| 7,409,490 B2 | 8/2008 | Liu | |
| 7,409,492 B2 | 8/2008 | Tanaka et al. | |
| 7,437,508 B2 | 10/2008 | Hajji | |
| 7,441,067 B2 | 10/2008 | Gorobets et al. | |
| 7,444,360 B2 * | 10/2008 | Frondozo et al. | 1/1 |
| 8,006,166 B2 * | 8/2011 | Roohparvar et al. | 714/768 |
| 2002/0099908 A1 * | 7/2002 | Yamamoto et al. | 711/114 |
| 2006/0047896 A1 * | 3/2006 | Nguyen et al. | 711/112 |
| 2007/0204128 A1 | 8/2007 | Lee et al. | |
| 2007/0233931 A1 | 10/2007 | Tanaka et al. | |
| 2007/0239927 A1 | 10/2007 | Rogers et al. | |
| 2008/0059698 A1 * | 3/2008 | Kabir et al. | 711/114 |
| 2008/0091872 A1 | 4/2008 | Bennett et al. | |
| 2008/0098158 A1 | 4/2008 | Kitahara | |
| 2008/0104444 A1 | 5/2008 | Kojima et al. | |
| 2008/0126680 A1 | 5/2008 | Lee et al. | |
| 2008/0140918 A1 | 6/2008 | Sutardja | |
| 2008/0155160 A1 | 6/2008 | McDaniel | |
| 2008/0158958 A1 | 7/2008 | Sokolov et al. | |
| 2008/0183947 A1 | 7/2008 | Shone et al. | |
| 2008/0201392 A1 | 8/2008 | Nakajima et al. | |
| 2008/0215800 A1 | 9/2008 | Lee et al. | |
| 2008/0276038 A1 | 11/2008 | Tanaka et al. | |
| 2009/0125671 A1 | 5/2009 | Flynn et al. | |
| 2009/0172335 A1 | 7/2009 | Kulkarni et al. | |
| 2009/0319743 A1 | 12/2009 | Ash et al. | |
| 2010/0005228 A1 | 1/2010 | Fukutomi et al. | |
| 2010/0115183 A1 * | 5/2010 | Araki et al. | 711/103 |
| 2010/0125695 A1 | 5/2010 | Wu et al. | |
| 2010/0205359 A1 | 8/2010 | Tanaka et al. | |
| 2010/0218070 A1 * | 8/2010 | Franceschini et al. | 714/760 |

FOREIGN PATENT DOCUMENTS

| | | |
|---|---|---|
| EP | 1840722 | 3/2007 |
| WO | 9917204 | 4/1999 |
| WO | 9926150 | 5/1999 |
| WO | 2007112555 | 10/2007 |

OTHER PUBLICATIONS

Gray J. et al, "Flash Disk Opportunity for Server Applications", ACM Queue, pp. 18-23, Jul./Aug. 2008.

Dinkelman, T., "SSDs a Shift in Data Storage", Micron Technology, Inc., Aug. 2008, pp. 1-26.

Pariseau, B., "Are Solid-State Disks Ready for the Enterprise?", [online], [Retrieved Mar. 11, 2009], retrieved from the internet at <URL http://searchStorage.techtarget.com/magazineFeature/0,296894,sid5_gci1334535,00html, 2 pp.

Chang, L., "Hybrid Solid State Disks:Combining Hetergeneouos NAND Flash in Large SSDs" ASPDAC 2008, [online] retrieved from the internet at URL <http://www.aspdac.com/aspdac2008/Archive_Folder/5B_Slides/5B-1.pdf, 26 pp.

"Silicon Motion's Hybrid SLC/MLC SSD Controller", Yahoo! Message Boards, posted on Jun. 24, 2008, retrieved from the internet at <URL http://messages.finance.yahoo/stocks_(A to Z) / Stocks_S/threadview?m=tm&bn=22578&tid=10968&mid=10968&tof=18&off=1, 3 pp.

Schmid, P., "Apacer Mixes Fast SLC with MLC Flash on a Single Drive", Tom's Hardware, Jun. 4, 2008, retrieved from the Internet at URL< http://www.tomshardware.com/news/FlashSSD-SLC-MLC.5571.html, 2 pp.

U.S. Appl. No. 12/495,244, filed Jun. 30, 2009, entitled "Wear Leveling of Solid State Disks Distributed in a Plurality of Redundant Array of Independent Disk Ranks", invented by Michael Thomas Benhase.

International Search Report for International Application No. PCT/EP2010/062509, filed Aug. 26, 2010, dated Nov. 5, 2010, 11pgs.

Lee. S. et al., "Advances in Flash Memory SSD Technology for Enterprise Database Applications", SIGMOD' 09, Jun. 29-Jul. 2, 2009, 8 pgs, Providence, Rhode Island, U.S.A.

S. Lowe, "Non-Standard RAID Levels Primer: RAID 5EE", dated May 29, 2007, Techrepublic, pp. 1-3.

* cited by examiner

WEAR LEVELING OF SOLID STATE DISKS BASED ON USAGE INFORMATION OF DATA AND PARITY RECEIVED FROM A RAID CONTROLLER

BACKGROUND

1. Field

The disclosure relates to a method, a system, and a computer program product for wear leveling of solid state disks based on usage information of data and parity received from a RAID controller.

2. Background

A solid state disk (SSD) may comprise a data storage device that uses solid state memory to store persistent digital data. Solid state disks may include flash memory or memory of other types. Solid state disks may be accessed much faster in comparison to electromechanically accessed data storage devices, such as, hard disks. Certain solid state disks can only be put through a limited number of erase cycles before becoming unreliable. Techniques exist for wear leveling and scrubbing to increase the endurance within solid state disks.

Redundant Array of Independent Disks (RAID) is a computer data storage scheme. In certain types of RAID implementations data and parity information may be written in stripes across a plurality of disks. In such RAID schemes one or more disks may fail without loss of data. For example, in an exemplary RAID-6 array, data and parity may be distributed across at least four disks and a RAID array that implements the RAID-6 scheme can recover from the failure of as many as two disks. RAID arrays may be formed from hard disks, solid state disks or from other types of storage media.

In Small Computer Systems Interface (SCSI) based storage operations, commands are sent via a Command Descriptor Block (CDB). Each CDB may be comprised of a fixed number of bytes, such as 10, 12, or 16 bytes. Variable-length CDBs may also be allowed in certain SCSI storage operations. CDBs may be comprised of a one byte operation code followed by certain command-specific parameters. SCSI based storage operations may be used in association with RAID based computer data storage schemes.

SUMMARY OF THE PREFERRED EMBODIMENTS

Provided are a method, a system, and a computer program product, wherein a controller configures a plurality of solid state disks as a redundant array of independent disks (RAID), wherein the plurality of solid state disks store a plurality of blocks, and wherein storage areas of the plurality of solid state disks corresponding to at least some blocks of the plurality of blocks have different amounts of estimated life expectancies. The controller includes in data structures associated with a block that is to be stored in the storage areas of the plurality of solid state disks an indication that the block includes parity information corresponding to the RAID, wherein parity information comprises information corresponding to an error correction mechanism to protect against a disk failure. The controller sends the data structures to the plurality of solid state disks, wherein the plurality of solid state disks allocate a storage area that is estimated to have a relatively greater life expectancy in comparison to other storage areas to store the block that includes the parity information.

In additional embodiments, the data structures are first data structures, the block is a first block, the storage area is a first storage area, and the indication is a first indication. The controller includes in second data structures associated with a second block that is to be stored in the storage areas of the solid state disks a second indication, wherein the second indication indicates how many data drives are present in the RAID, wherein the plurality of solid state disks allocate the second block to a second storage area that is estimated to have a relatively greater life expectancy in comparison to a third storage area that stores a third block, in response to determining that the second block is for a greater number of data drives in comparison to the third block that is for a fewer number of data drives.

In further embodiments, the first and the second data structures are included in a Small Computer Systems Interface (SCSI) command descriptor block (CDB), wherein unused bits of the CDB are used to store the first and the second data structures.

The yet further embodiments, determining of the allocation of the first and the second storage areas and additional storage areas to the first, second, third, and additional blocks are based on at least a RAID rank size and a RAID type.

In additional embodiments, the first and the second data structures are included in configuration registers of a Peripheral Component Interconnect (PCI) compliant card.

In further embodiments, the data structures are first data structures, the block is a first block, the storage area is a first storage area, and the indication is a first indication. The controller includes in second data structures associated with a second block that is to be stored in the storage areas of the solid state disks a second indication, wherein the second indication indicates a relative frequency with which the data stored in the second block is likely to be updated, wherein a second storage area that is estimated to have a relatively greater life expectancy in comparison to other storage areas is used to store the second block, wherein the second block has a higher relative frequency of updates in comparison to other blocks.

The yet further embodiments, firmware included in the plurality of solid state disks receives the data structures sent by the controller. The firmware included in the plurality of solid state disks allocates the storage area that is estimated to have the relatively greater life expectancy in comparison to the other storage areas to store the block that includes the parity information.

In additional embodiments, computer-readable code is integrated into the controller, wherein the code in combination with the controller is enabled to perform the operations of the configuring by the controller of the plurality of solid state disks, the including by the controller of the data structures, and the sending by the controller of the data structures.

BRIEF DESCRIPTION OF THE DRAWINGS

Referring now to the drawings in which like reference numbers represent corresponding parts throughout.

DETAILED DESCRIPTION

Figure 1:
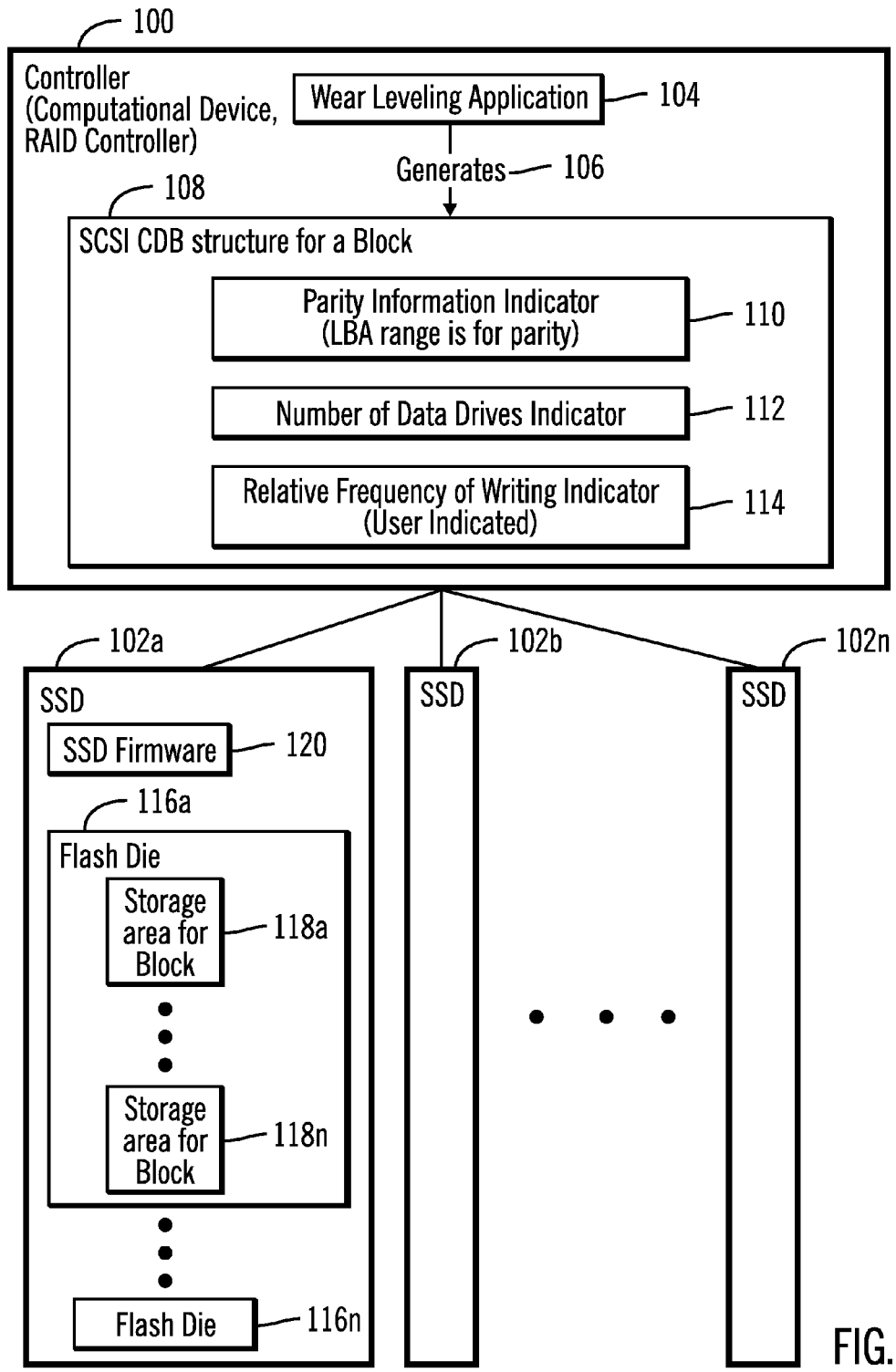
FIG. 1 illustrates a block diagram of a first exemplary controller that controls a plurality of solid state disks, in accordance with certain embodiments.

In the following description, reference is made to the accompanying drawings which form a part hereof and which illustrate several embodiments. It is understood that other embodiments may be utilized and structural and operational changes may be made.

RAID arrays may be formed from hard disks or solid state disks. However, solid state disks may wear out relatively faster in comparison to hard disks, as a result of write endurance and read disturb problems associated with solid state disks.

Solid state disks that are coupled to a RAID controller may not be able to determine the type of data blocks serviced by the solid state disks. For certain solid state disks, the serviced data may be an exemplary SCSI block or a set of data at particular Peripheral Component Interconnect Express (PCIE) addresses. As solid state disks wear level, the solid state disks may tend to treat all data blocks in a similar manner. As a result, the endurance of the solid state disks may be determined by the weakest blocks, wherein the weakest blocks are the blocks with the least life expectancy. For example, in a solid state disk with 128 flash dies, there may be a wide variability in estimated life expectancies among different storage areas of these 128 flash dies, and even within a given flash die.

In certain embodiments, in order to effectively wear level solid state disks, the expected life of storage areas in the solid state disks may be taken into account. Certain embodiments provide information to the solid state disks about the expected update frequency of blocks in information sent from the controller. For example in certain embodiments there may be a set of data that is deterministic and that may cause constant increased write demand, such as the blocks involved in RAID 5 and certain RAID 6 implementations. Certain embodiments provide information from the controller to the solid state disks that a given block is a P or Q logical block address (LBA) [i.e., the block is for parity data represented by P or Q in RAID terminology]. The provided information may allow the solid state disks to store the given block in storage areas determined to have relatively greater life expectancy.

For example, in a 5+P RAID rank, the parity may be written 5 times more than any data strip for small block updates. Certain embodiments pass data structures to the solid state disks, wherein the data structures indicate that the logical block address range being written is a parity strip.

In certain embodiments, by using SCSI mode pages or configuration registers in a PCIE card, the following information is sent from a controller to solid state disks that have been configured as a RAID by the controller:

(i) Parity strip handling enable (In such situations the solid state disks are instructed to treat LBAs noted as parity in a RAID rank as highly accessed sectors); and (ii) Number of data drives in the RAID Rank (The number of exemplary data drives may vary from 2 to 255. The number represents the multiplier to expect for write frequency over the data elements.).

In certain embodiments, based on the information provided by the controller, the solid state disks may assign blocks that are more likely to be written repeatedly to storage areas that are determined to have a relatively longer life expectancy in comparison to other storage areas. For example, blocks that include parity information and blocks corresponding to RAID ranks with a relatively larger number of data drives are more likely to be written repeatedly and may be stored in storage areas that are determined to have relatively longer life expectancy in comparison to other storage areas.

Exemplary Embodiments

FIG. 1 illustrates a block diagram of a first exemplary controller 100 that controls a plurality of solid state disks 102a, 102b, . . . , 102n, in accordance with certain embodiments. The exemplary controller 100 may comprise any suitable computational device, such as, a personal computer, a mainframe, a workstation, a server, a client, a telephony device, a laptop, a blade computer, etc. The exemplary controller 100 may be referred to as a RAID controller because the plurality of solid state disks 102a . . . 102n are configured as one or more RAIDs and the controller 100 controls the operations of the one or more RAIDs.

A wear leveling application 104 included in the controller 100 generates 106 a SCSI CDB structure 108 for a block, wherein the SCSI CDB data structure 108 includes one or more of a parity information indicator 110, a number of data drives indicator 112, and a relative frequency of writing indicator 114.

The controller 100 uses the SCSI CDB structure 108 to send information related to the block to the solid state disks 102a . . . 102n. The parity information indicator 110 indicates whether the block is used to store parity data. The number of data drives indicator 112 indicates the number of data drives in the RAID configuration for which the block is to be written. For example, if the RAID configuration is 5+P (i.e., 5 data drives and 1 parity drive) then the number of data drives indicator 112 indicates 5. The relative frequency of writing indicator 114 is an optional indicator that may be filled in by a user or an automated application, wherein the relative frequency of writing indicator is an estimated measure of how frequently the block is likely to be written. For example, certain types of blocks may be updated more frequently than other types of blocks and the user may provide such information for storage in the relative frequency of writing indicator 114.

In FIG. 1, exemplary solid state disk 102a is comprised of a plurality of flash dies 116a . . . 116n, wherein each flash die has one or more storage areas for blocks. For example, flash die 116a has storage areas 118a . . . 118n, wherein different storage areas 118a . . . 118n may have different remaining life expectancies because of uneven wear. The exemplary solid state disk 102a also includes solid state disk firmware 120, wherein the solid state disk firmware 120 is used to wear level the storage areas on the flash dies 116a . . . 116n by using the information provided by the SCSI CDB structure 108 sent by the controller 100 to the solid state disks 102a . . . 102n. The other solid state disk 102b ... 102n also have flash dies, firmware, and storage areas in a manner similar to that of solid state disk 102a.

Therefore, FIG. 1 illustrates certain embodiments in which an exemplary SCSI CDB structure 108 is used by a controller 100 to send additional information on blocks to solid state disks 102a ... 102n that have been configured in a RAID scheme. The additional information allows the solid state disks 102a ... 102n to determine how frequently the blocks are likely to be modified. Blocks that are likely to be modified relatively more frequently are stored in those storage areas that have a relatively greater life expectancy in comparison to other storage areas.

Figure 2:
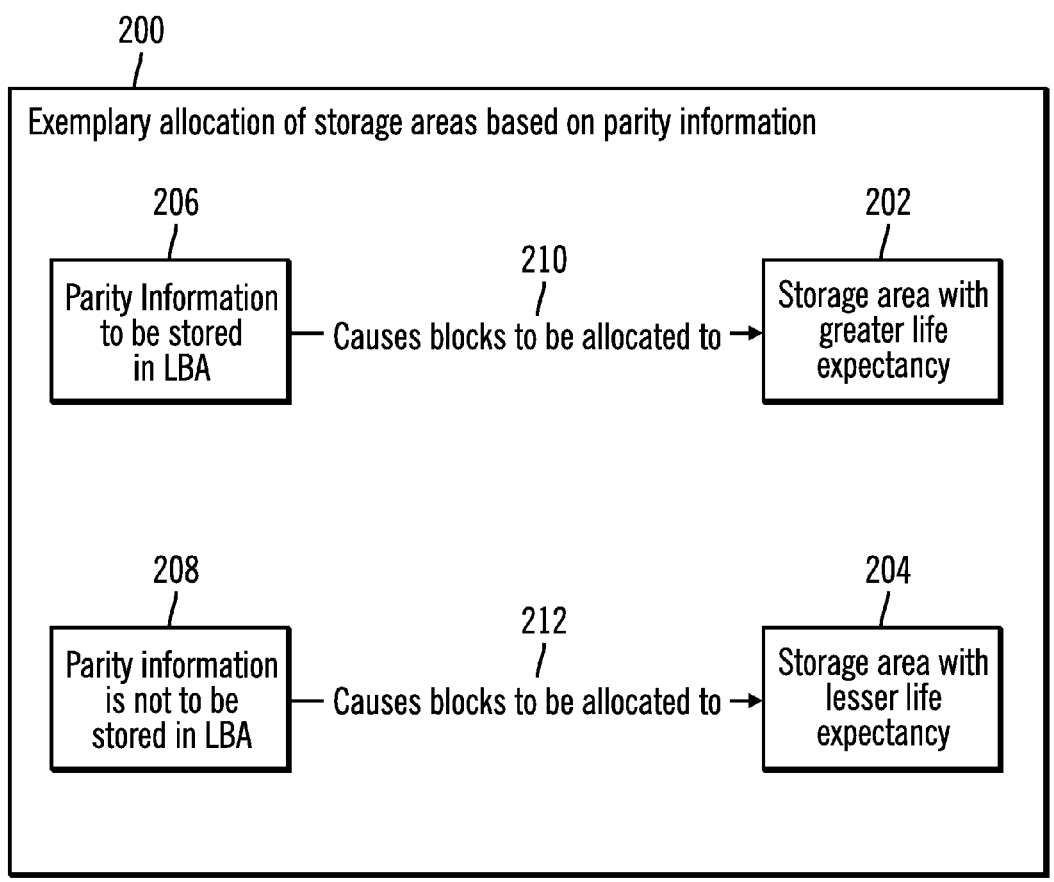
FIG. 2 illustrates a block diagram that shows an exemplary allocation of storage areas based on parity information, in accordance with certain embodiments.

FIG. 2 illustrates a block diagram 200 that shows an exemplary allocation of storage areas based on parity information, in accordance with certain embodiments. Two exemplary storage areas 202, 204 are shown in FIG. 2, where the two exemplary storage areas 202, 204 are found in the solid state disks 102a ... 102n that have been configured in a RAID scheme. The solid state disk firmware 120 may have determined that the storage area 202 has a greater life expectancy than storage area 204. The life expectancy of a storage area provides a measure of the amount of life left for the storage area. Calculation of the values of life expectancy may take into account any of the methods and procedures that solid state disks use to deal with solid state disk endurance.

In certain embodiments, parity information is indicated (reference numeral 206) as being stored in a logical block address (LBA), i.e., a block is for storing parity information. In other embodiments, parity information is not indicated (reference numeral 208) as being stored in a logical block address, i.e., a block is not for storing parity information. Since parity is likely to be updated frequently, in response to the parity information being stored in the LBA (reference numeral 206) the block is allocated (reference numeral 210) in the storage area 202 that has a greater life expectancy. Additionally, in response to the parity information not being stored in the LBA (reference numeral 208) the block is allocated (reference numeral 212) in the storage area 204 that has a lesser life expectancy.

Figure 3:
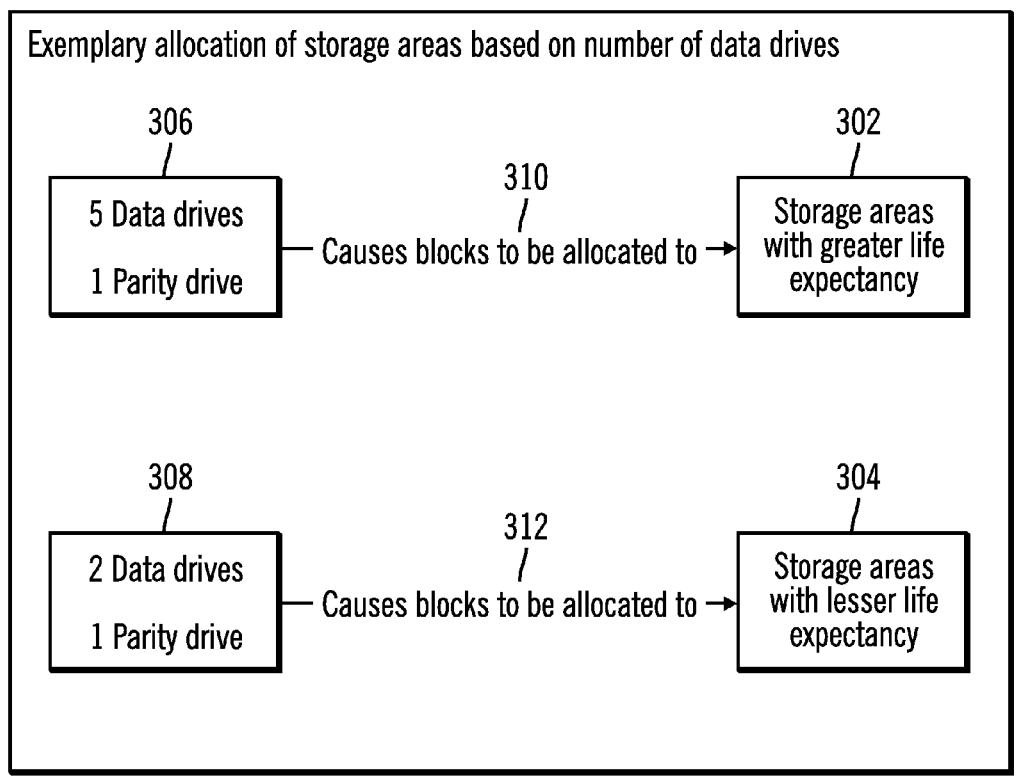
FIG. 3 illustrates a block diagram that shows an exemplary allocation of storage areas based on the number of data drives, in accordance with certain embodiments.

FIG. 3 illustrates a block diagram that shows an exemplary allocation of storage areas based on the number of data drives, in accordance with certain embodiments. Two exemplary storage areas 302, 304 are shown in FIG. 3, where the two exemplary storage areas 302, 304 are found in the solid state disks 102a ... 102n that have been configured in a RAID scheme. The solid state disk firmware 120 may have determined that the storage area 302 has a greater life expectancy than storage area 304.

In certain embodiments, 5 data drives are indicated (reference numeral 306) in the RAID configuration for blocks corresponding to a logical block address (LBA), e.g., the RAID configuration may be 5+P with 5 data drives and 1 parity drive, In certain embodiments, 2 data drives are indicated (reference numeral 308), e.g., the RAID configuration is 2+P with 2 data drives and 1 parity drive.

Since blocks corresponding to RAID schemes that have more data drives are likely to be updated relatively more frequently, in response to 5 data drives being indicated (reference numeral 306) the block is allocated (reference numeral 310) in the storage area 302 with greater life expectancy. Additionally, in response to 2 data drives being indicated (reference numeral 308) the block is allocated (reference numeral 312) in the storage area 304 with lesser life expectancy. Variations are possible with different RAID configurations such as 5+2P configurations (i.e. 5 data drives and 2 parity drives), 6+2P configuration (i.e., 6 data drives and 2 parity drives), etc.

Figure 4:
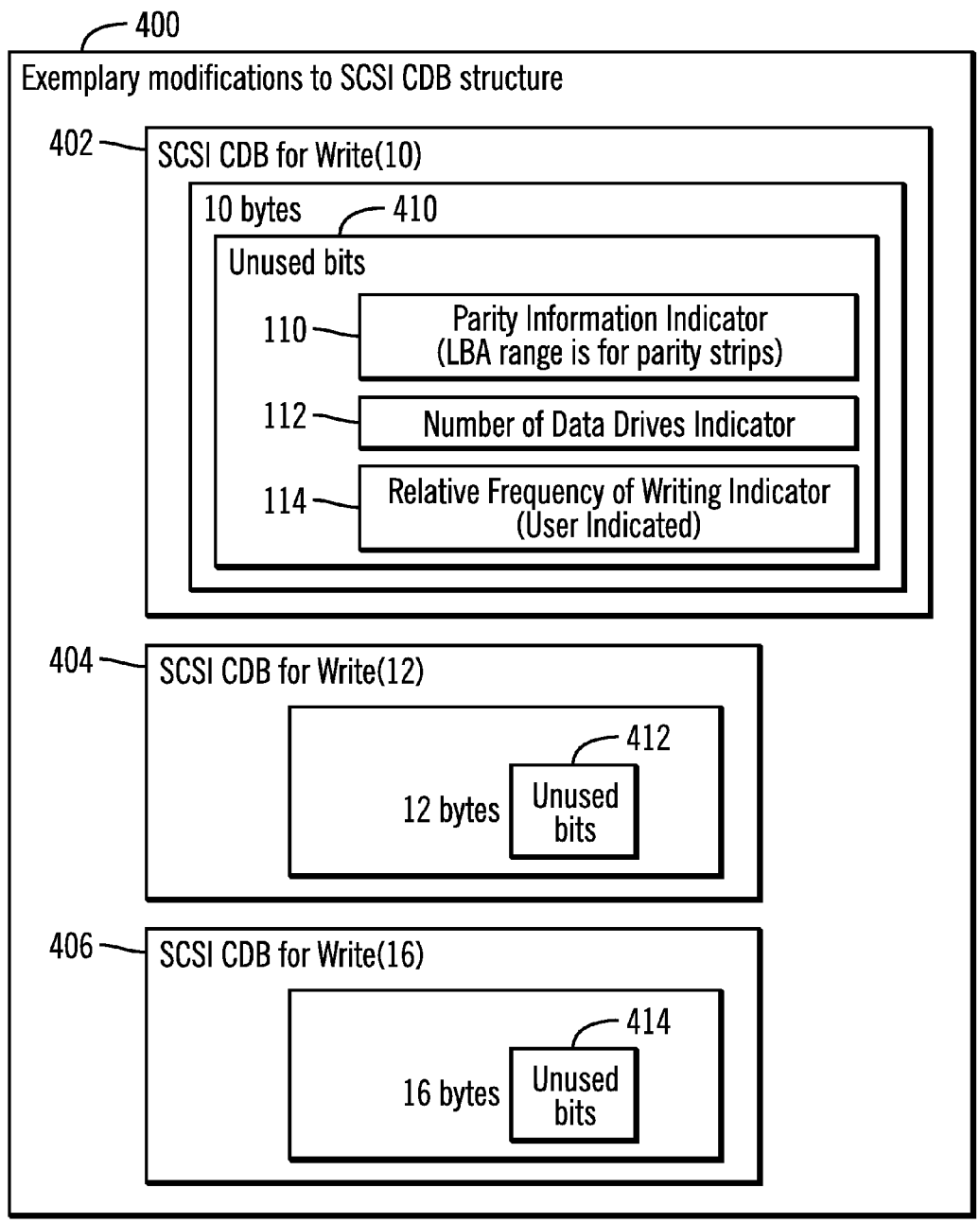
FIG. 4 illustrates a block diagram that shows exemplary SCSI CDB data structures, in accordance with certain embodiments.

FIG. 4 illustrates a block diagram 400 that shows exemplary SCSI CDB data structures 402, 404, 406, in accordance with certain embodiments. The SCSI CDB data structures 402, 404, 406 may be generated by the controller 100 for sending to the solid state disks 102a ... 102n.

Unused bits 410, 412, 414 in the SCSI CDB structures 402, 404, 406 may be used to convey the information on the parity information indicator 110, the number of data drives indicator 112, and the relative frequency of writing indicator 114. For example, in certain embodiments, existing SCSI CDB commands may be modified, such that at least the CDB for Write (10) 402, Write(12) 404 and Write(16) 406 and also write verify commands may be modified to contain a bit to specify that the LBA range specified is a parity strip and is expected to be updated more frequently than data, and the RAID controller 100 may generate the modified SCSI CDB data structures. In certain embodiments, when non-sequential operations are performed and in cases where full stride writes are not taking place such CDB commands may be modified.

While FIG. 4 shows that values for indicators 110, 112, 114 are sent via the SCSI CDB data structures 402, 404, 406, in alternative embodiments the indicators may be included in configuration registers of a Peripheral Component Interconnect (PCI) compliant card.

Figure 5:
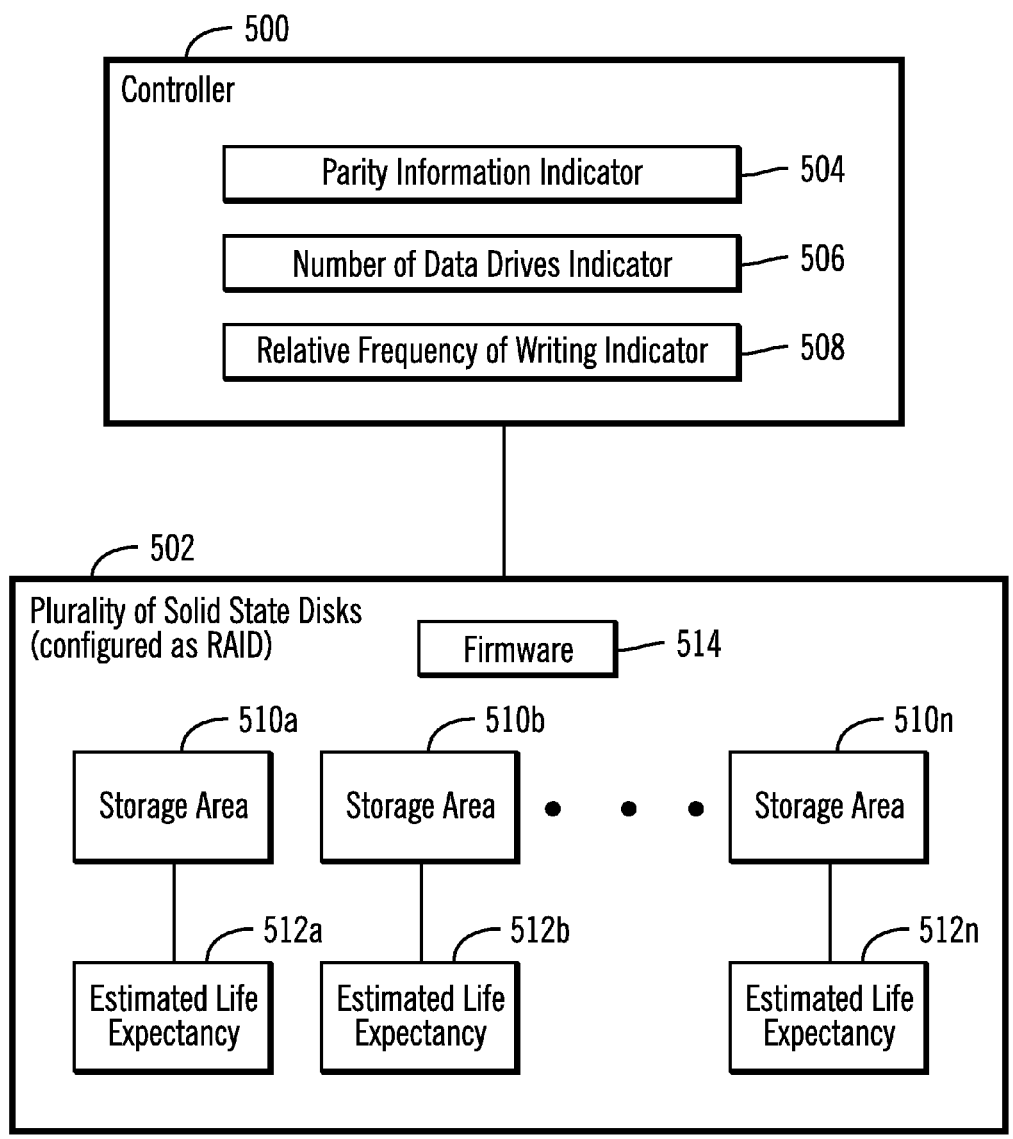
FIG. 5 illustrates a block diagram that shows a second exemplary controller that controls a plurality of solid state disks, in accordance with certain embodiments.

FIG. 5 illustrates a block diagram that shows a second exemplary controller 500 that controls a plurality of solid state disks 502, in accordance with certain embodiments. The second exemplary controller 500 may correspond to the first exemplary controller 100 shown in FIG. 1, and the plurality of solid state disks 502 may correspond to the plurality of solid state disks 102a ... 102n shown in FIG. 1.

The controller 500 generates and sends information via one or more of the data structures comprising the parity information indicator 504, the number of data drives indicator 506, and the relative frequency of writing indicator 508. The controller 500 configures the plurality of solid state disks 502 in accordance with a RAID scheme. The plurality of solid state disks 502 include a plurality of storage areas 510a, 510b, ..., 510n with corresponding estimated life expectancies 512a, 512b, ..., 512n. Firmware 514 implemented in one or more of the solid state disks 502 may be used to determine the estimated life expectancies 512a ... 512n and to allocate blocks sent by the controller 500 to the storage areas 510a ... 510n, based on the information included in the parity information indicator 504, the number of data drives indicator 506 and the relative frequency of writing indicator 508.

Figure 6:
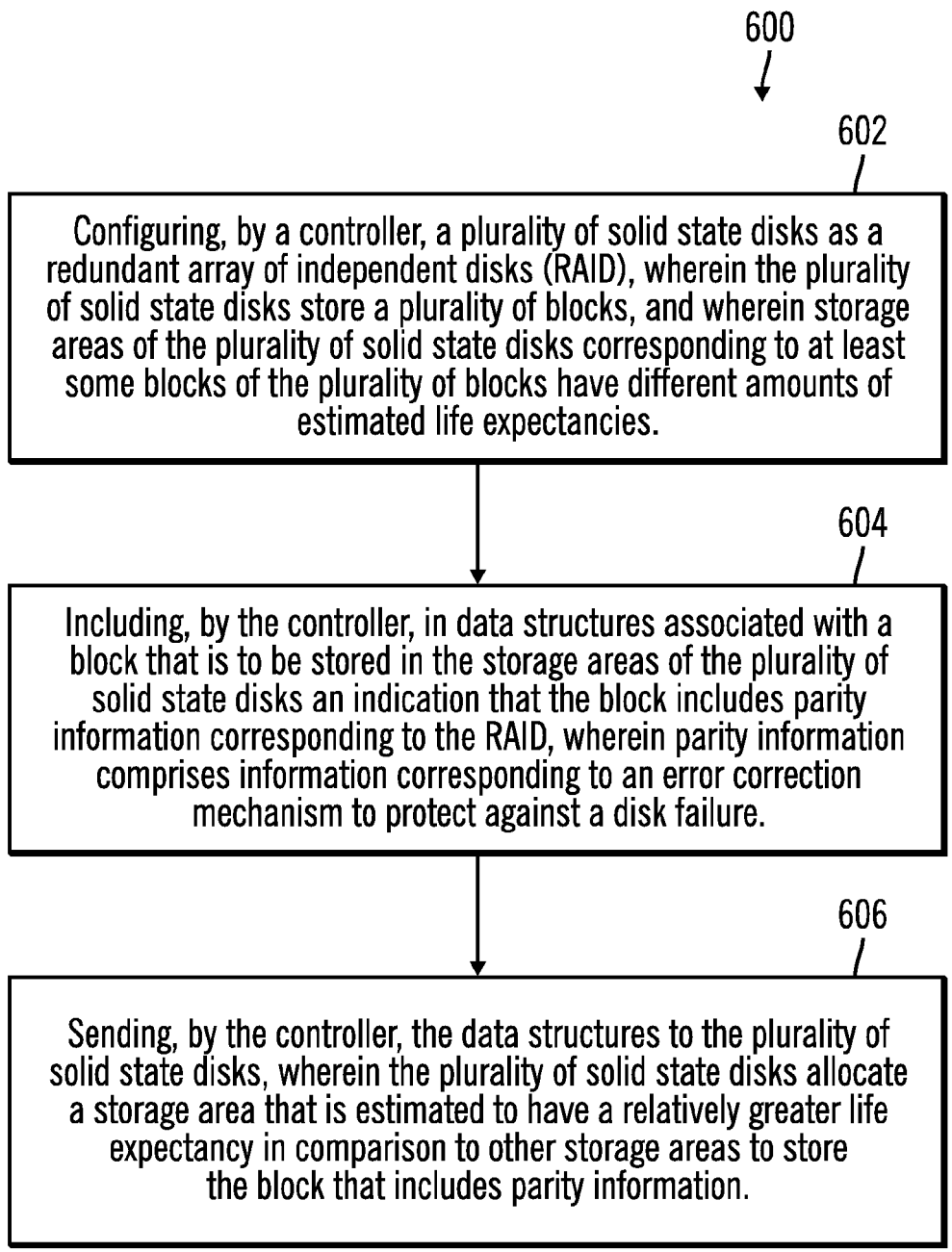
FIG. 6 illustrates a first flowchart that shows first operations implemented in an exemplary controller, in accordance with certain embodiments.

FIG. 6 illustrates a first flowchart 600 that shows first operations implemented in the exemplary controllers 100, 500, in accordance with certain embodiments. The first operations may be performed by an application such as the wear leveling application 104 that may be found in the controller 100, 500.

Control starts at block 602 in which an exemplary controller 500 configures a plurality of solid state disks 502 as a redundant array of independent disks (RAID), wherein the plurality of solid state disks 502 store a plurality of blocks, and wherein storage areas 510a ... 510n of the plurality of solid state disks corresponding to at least some blocks of the plurality of blocks have different amounts of estimated life expectancies 512a ... 512n.

The controller 500 includes (at block 604), in data structures associated with a block that is to be stored in the storage areas 510a ... 510n of the plurality of solid state disks 502, an indication 504 that the block includes parity information corresponding to the RAID, wherein parity information comprises information corresponding to an error correction mechanism to protect against a disk failure.

The controller 500 sends (at block 606), the data structures to the plurality of solid state disks 502, wherein the plurality of solid state disks 502 allocate a storage area that is estimated to have a relatively greater life expectancy in comparison to other storage areas to store the block that includes parity information.

Figure 7:
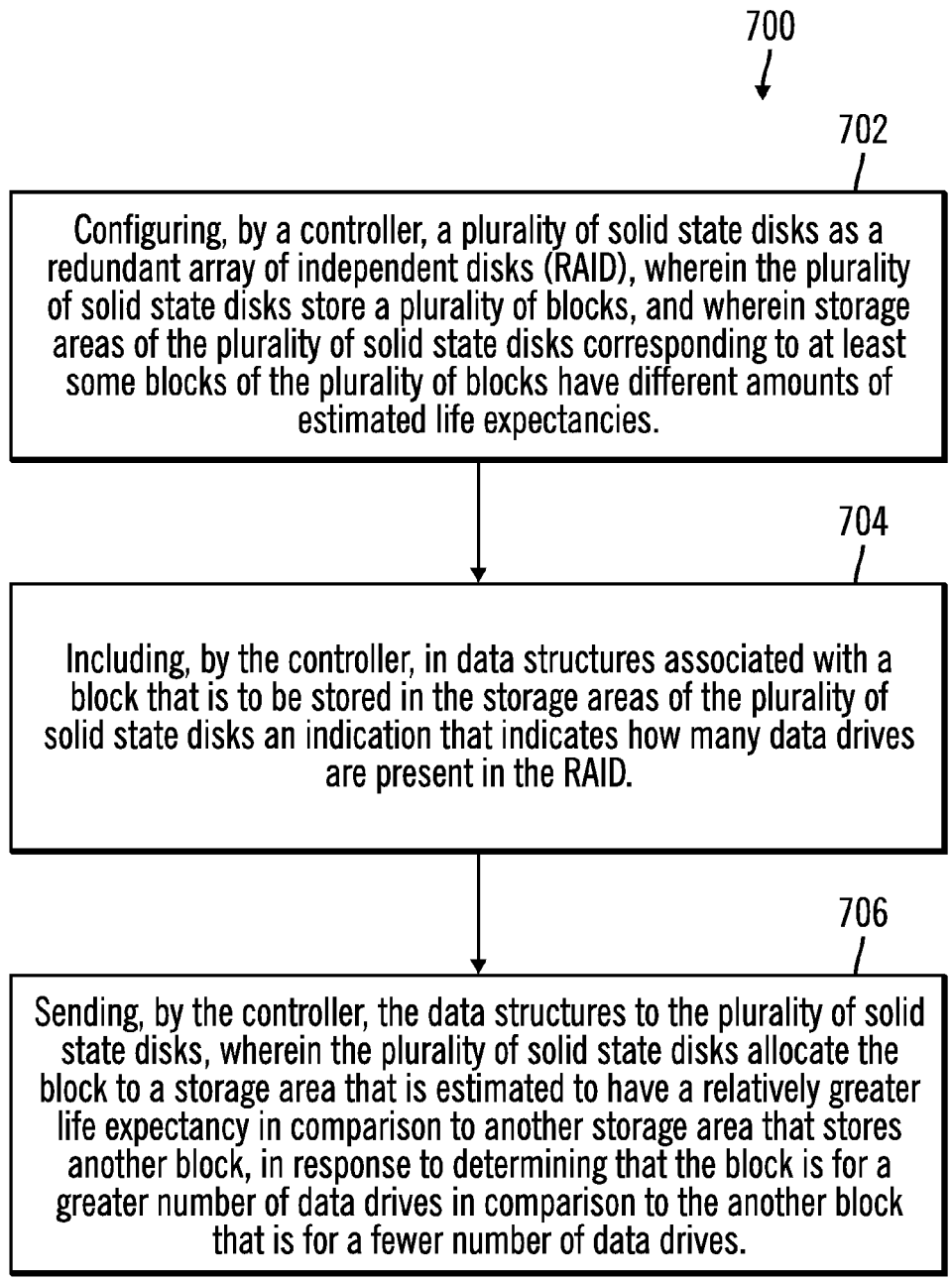
FIG. 7 illustrates a second flowchart that shows second operations implemented in an exemplary controller, in accordance with certain embodiments.

FIG. 7 illustrates a second flowchart 700 that shows second operations implemented in the exemplary controllers 100, 500, in accordance with certain embodiments. The second operations may be performed by an application such as the wear leveling application 104 that may be found in the controller 100, 500.

Control starts at block 702 in which the controller 500 configures a plurality of solid state disks 502 as a redundant array of independent disks (RAID), wherein the plurality of solid state disks 502 store a plurality of blocks, and wherein storage areas 510a . . . 510n of the plurality of solid state disks corresponding to at least some blocks of the plurality of blocks have different amounts of estimated life expectancies 512a . . . 512n.

The controller 500 includes (at block 704) in data structures associated with a block that is to be stored in the storage areas 510a . . . 510n of the plurality of solid state disks 502 an indication 506 that indicates how many data drives are present in the RAID.

The controller 500 sends (at block 706) the data structures to the plurality of solid state disks 502, wherein the plurality of solid state disks 502 allocate the block to a storage area that is estimated to have a relatively greater life expectancy in comparison to another storage area that stores another block, in response to determining that the block is for a greater number of data drives in comparison to the another block that is for a fewer number of data drives.

Figure 8:
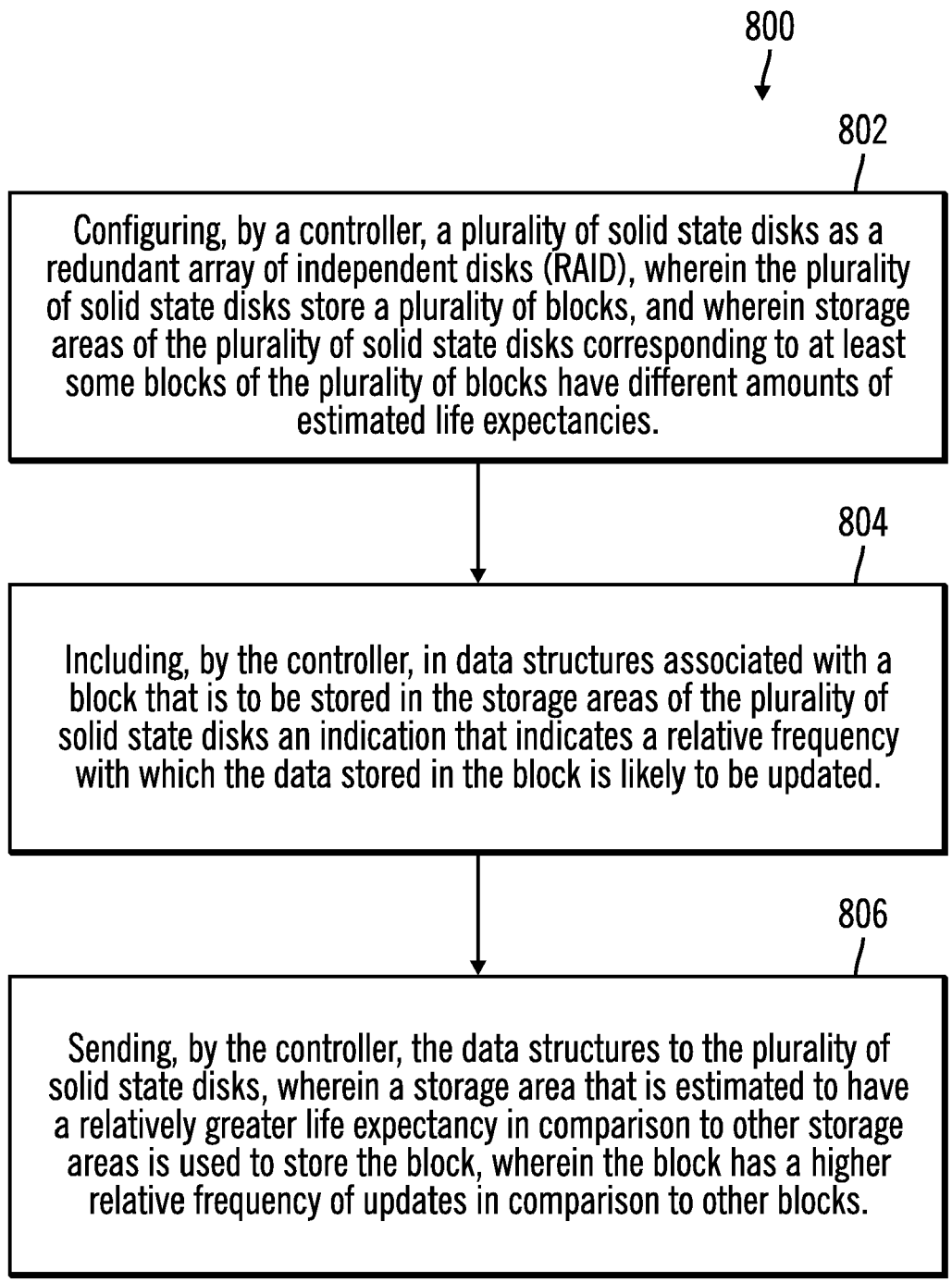
FIG. 8 illustrates a third flowchart that shows third operations implemented in an exemplary controller, in accordance with certain embodiments.

FIG. 8 illustrates a third flowchart 800 that shows third operations implemented in the exemplary controllers 100, 500, in accordance with certain embodiments. The second operations may be performed by an application such as the wear leveling application 104 that may be found in the controller 100, 500.

Control starts at block 802 in which the controller 500 configures a plurality of solid state disks 502 as a redundant array of independent disks (RAID), wherein the plurality of solid state disks 502 store a plurality of blocks, and wherein storage areas 510a . . . 510n of the plurality of solid state disks corresponding to at least some blocks of the plurality of blocks have different amounts of estimated life expectancies 512a . . . 512n.

The controller 500 includes (at block 804) in data structures associated with a block that is to be stored in the storage areas 510a . . . 510n of the plurality of solid state disks 502 an indication 508 that indicates a relative frequency with which the data stored in the block is likely to be updated. The indication 508 may be provided by a user or may be based on predetermined factors analyzed by an automated program resident in the controller 500.

The controller 500 sends (at block 806), the data structures to the plurality of solid state disks 502, wherein a storage area that is estimated to have a relatively greater life expectancy in comparison to other storage areas is used to store the block, wherein the block has a higher relative frequency of updates in comparison to other blocks.

While the flowcharts in FIGS. 6, 7, 8 have shown parity information indicator 504, number of data drives indictor 506, and relative frequency of writing indicator 508 being sent separately via the controller 500 to the plurality of solid state disks 502, in certain embodiments one or more of the parity information indicator 504, the number of data drives indictor 506, and the relative frequency of writing indicator 508 may be sent from the controller 500 to the plurality of solid state disks 502 as part of a SCSI CDB data structure 400. In such cases, indications provided by one or more of the plurality of indicators 504, 506, 508 are collectively used by the firmware 514 of the plurality of solid state disks 502 to determine the allocation of storage areas to blocks based on the estimated frequency of updates of the blocks provided by an analysis of information stored in the indicators 504, 506, 508. Other additional indicators besides indicators 504, 506, 508 may be sent in alternative embodiments. For example, in certain embodiments, determining the allocation of storage areas 510a . . . 510n to blocks may be based on indications provided by the controller 500 of at least a RAID rank size and a RAID type.

Therefore, FIGS. 1-8 illustrate certain embodiments in which a RAID controller 100, 500 provides hints on the likely frequency of usage information for blocks to solid state disks 102a . . . 102n. The frequency of usage information may be based at on whether the blocks store parity information and/or on the number of data drives in a RAID configuration. The frequency of usage information may be used by the plurality of solid state disks 102a . . . 102n, 500 to allocate storage areas with a greater life expectancy to blocks that are likely to be updated more frequently in comparison to other blocks.

Additional Embodiment Details

The described operations may be implemented as a method, apparatus or computer program product using standard programming and/or engineering techniques to produce software, firmware, hardware, or any combination thereof. Accordingly, aspects of the embodiments may take the form of an entirely hardware embodiment, an entirely software embodiment (including firmware, resident software, microcode, etc.) or an embodiment combining software and hardware aspects that may all generally be referred to herein as a "circuit," "module" or "system." Furthermore, aspects of the embodiments may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language such as Java*, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

*Java is a trademark or registered trademark of Sun Microsystems, Inc.

Aspects of the present invention are described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

Figure 9:
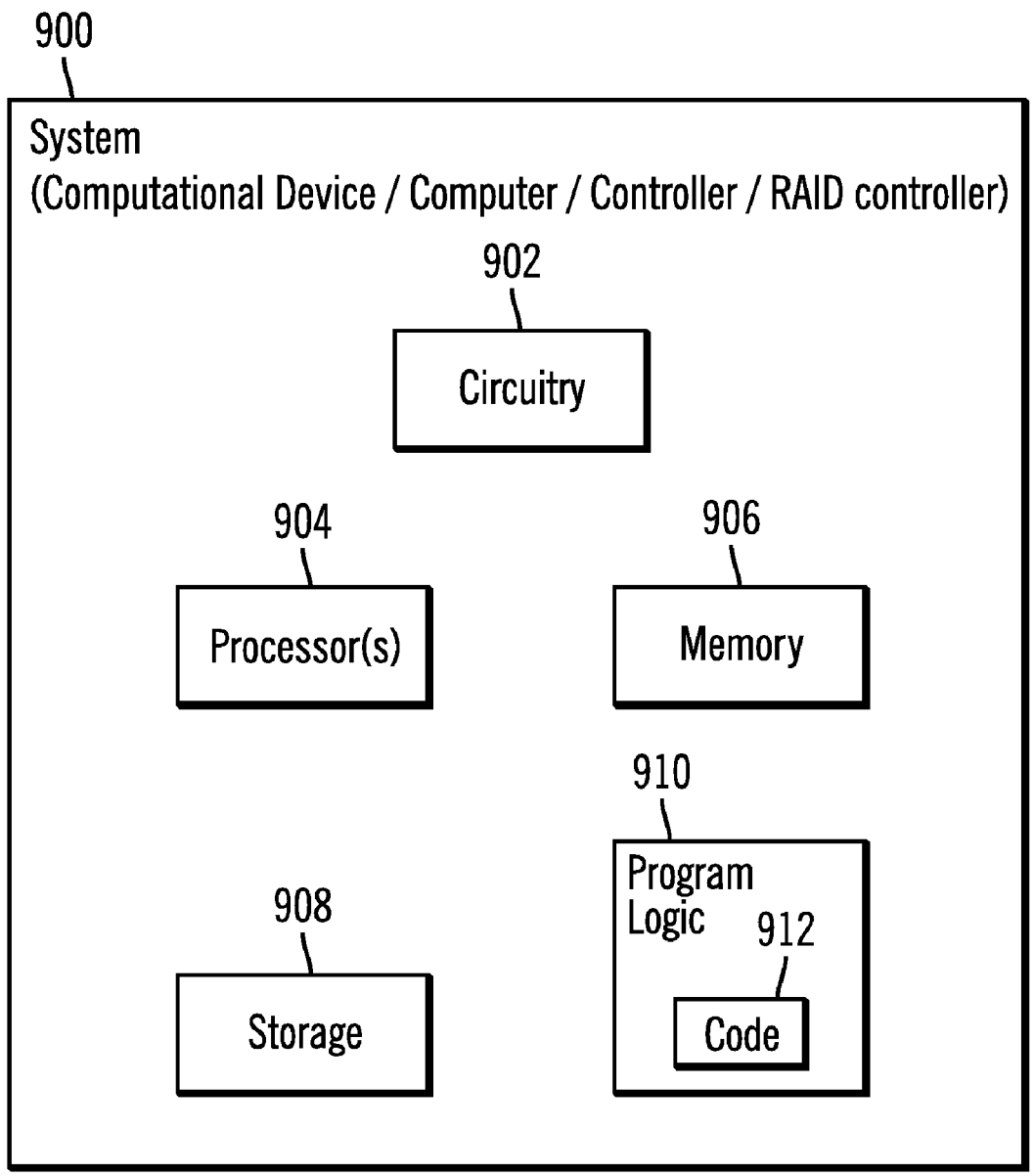
FIG. 9 illustrates a block diagram of a computational system that shows certain elements that may be included in the controllers of FIGS. 1 and 5 in accordance with certain embodiments.

FIG. 9 illustrates a block diagram that shows certain elements that may be included in the system 900 in accordance with certain embodiments. The system 900 may comprise the computational device 100, 500 (e.g., a RAID controller), and may include a circuitry 902 that may in certain embodiments include at least a processor 904. The system 900 may also include a memory 906 (e.g., a volatile memory device), and storage 908. The storage 908 may include a non-volatile memory device (e.g., EEPROM, ROM, PROM, RAM, DRAM, SRAM, flash, firmware, programmable logic, etc.), magnetic disk drive, optical disk drive, tape drive, etc. The storage 908 may comprise an internal storage device, an attached storage device and/or a network accessible storage device. The system 900 may include a program logic 910 including code 912 that may be loaded into the memory 906 and executed by the processor 904 or circuitry 902. In certain embodiments, the program logic 910 including code 912 may be stored in the storage 908. In certain other embodiments, the program logic 910 may be implemented in the circuitry 902. Therefore, while FIG. 9 shows the program logic 910 separately from the other elements, the program logic 910 may be implemented in the memory 906 and/or the circuitry 902.

Certain embodiments may be directed to a method for deploying computing instruction by a person or automated processing integrating computer-readable code into a computing system, wherein the code in combination with the computing system is enabled to perform the operations of the described embodiments.

The terms "an embodiment", "embodiment", "embodiments", "the embodiment", "the embodiments", "one or more embodiments", "some embodiments", and "one embodiment" mean "one or more (but not all) embodiments of the present invention(s)" unless expressly specified otherwise.

The terms "including", "comprising", "having" and variations thereof mean "including but not limited to", unless expressly specified otherwise.

The enumerated listing of items does not imply that any or all of the items are mutually exclusive, unless expressly specified otherwise.

The terms "a", "an" and "the" mean "one or more", unless expressly specified otherwise.

Devices that are in communication with each other need not be in continuous communication with each other, unless expressly specified otherwise. In addition, devices that are in communication with each other may communicate directly or indirectly through one or more intermediaries.

A description of an embodiment with several components in communication with each other does not imply that all such components are required. On the contrary a variety of optional components are described to illustrate the wide variety of possible embodiments of the present invention.

Further, although process steps, method steps, algorithms or the like may be described in a sequential order, such processes, methods and algorithms may be configured to work in alternate orders. In other words, any sequence or order of steps that may be described does not necessarily indicate a requirement that the steps be performed in that order. The steps of processes described herein may be performed in any order practical. Further, some steps may be performed simultaneously.

When a single device or article is described herein, it will be readily apparent that more than one device/article (whether or not they cooperate) may be used in place of a single device/article. Similarly, where more than one device or article is described herein (whether or not they cooperate), it will be readily apparent that a single device/article may be used in place of the more than one device or article or a different number of devices/articles may be used instead of the shown number of devices or programs. The functionality and/or the features of a device may be alternatively embodied by one or more other devices which are not explicitly described as having such functionality/features. Thus, other embodiments of the present invention need not include the device itself.

At least certain operations that may have been illustrated in the figures show certain events occurring in a certain order. In alternative embodiments, certain operations may be performed in a different order, modified or removed. Moreover, steps may be added to the above described logic and still conform to the described embodiments. Further, operations described herein may occur sequentially or certain operations may be processed in parallel. Yet further, operations may be performed by a single processing unit or by distributed processing units.

The foregoing description of various embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto. The above specification, examples and data provide a complete description of the manufacture and use of the composition of the invention. Since many embodiments of the invention can be made without departing from the spirit and scope of the invention, the invention resides in the claims hereinafter appended.

What is claimed is:

1. A method, comprising:
configuring, by a controller, a plurality of solid state disks as a redundant array of independent disks (RAID), wherein the plurality of solid state disks store a plurality of blocks, and wherein storage areas of the plurality of solid state disks corresponding to at least some blocks of the plurality of blocks have different amounts of estimated life expectancies;
including, by the controller, in data structures associated with a block that is to be stored in the storage areas of the plurality of solid state disks, an indication that the block includes parity information corresponding to the RAID, wherein parity information comprises information corresponding to an error correction mechanism to protect against a disk failure; and
sending, by the controller, the data structures to the plurality of solid state disks, wherein the plurality of solid state disks allocate a storage area that is estimated to have a relatively greater life expectancy in comparison to other storage areas to store the block that includes the parity information, wherein the block is a first block and the data structures are first data structures, wherein second data structures associated with a second block contain an indication of how many data drives are present in the RAID, and wherein the second block is stored in an area of greater life expectancy than a third block in response to determining that the second block is for a greater number of data drives than the third block.

2. The method of claim 1, wherein the first and the second data structures are included in a Small Computer Systems Interface (SCSI) command descriptor block (CDB), and wherein unused bits of the CDB are used to store the first and the second data structures.

3. The method of claim 1 wherein the first and the second data structures are included in configuration registers of a Peripheral Component Interconnect (PCI) compliant card.

4. The method of claim 1, wherein the storage area is a first storage area, wherein the indication is a first indication, the method further comprising:

including, by the controller, in the second data structures associated with the second block that is to be stored in the storage areas of the solid state disks a second indication, wherein the second indication indicates a relative frequency with which the data stored in the second block is likely to be updated, wherein a second storage area that is estimated to have a relatively greater life expectancy in comparison to other storage areas is used to store the second block, wherein the second block has a higher relative frequency of updates in comparison to other blocks.

5. A controller in communication with a plurality of solid state disks, the controller comprising:
a memory; and
a processor coupled to the memory, wherein the processor performs operations, the operations comprising:
configuring a plurality of solid state disks as a redundant array of independent disks (RAID), wherein the plurality of solid state disks store a plurality of blocks, and wherein storage areas of the plurality of solid state disks corresponding to at least some blocks of the plurality of blocks have different amounts of estimated life expectancies;
including in data structures associated with a block that is to be stored in the storage areas of the plurality of solid state disks, an indication that the block includes parity information corresponding to the RAID, wherein parity information comprises information corresponding to an error correction mechanism to protect against a disk failure; and
sending the data structures to the plurality of solid state disks, wherein the plurality of solid state disks allocate a storage area that is estimated to have a relatively greater life expectancy in comparison to other storage areas to store the block that includes the parity information, wherein the block is a first block and the data structures are first data structures, wherein second data structures associated with a second block contain an indication of how many data drives are present in the RAID, and wherein the second block is stored in an area of greater life expectancy than a third block in response to determining that the second block is for a greater number of data drives than the third block.

6. The controller of claim 5, wherein the first and the second data structures are included in a Small Computer Systems Interface (SCSI) command descriptor block (CDB), and wherein unused bits of the CDB are used to store the first and the second data structures.

7. The controller of claim 5, wherein the first and the second data structures are included in configuration registers of a Peripheral Component Interconnect (PCI) compliant card.

8. The controller of claim 5, wherein the storage area is a first storage area, wherein the indication is a first indication, the operations further comprising:
including, by the controller, in the second data structures associated with the second block that is to be stored in the storage areas of the solid state disks a second indication, wherein the second indication indicates a relative frequency with which the data stored in the second block is likely to be updated, wherein a second storage area that is estimated to have a relatively greater life expectancy in comparison to other storage areas is used to store the second block, wherein the second block has a higher relative frequency of updates in comparison to other blocks.

9. A computer program product for wear leveling of a plurality of solid state disks, the computer program product comprising:

a computer readable storage medium comprising at least one of a memory, a magnetic disk, and an optical disc, the computer readable storage medium having computer readable program code embodied therewith, the computer readable program code configured to:

configure a plurality of solid state disks as a redundant array of independent disks (RAID), wherein the plurality of solid state disks store a plurality of blocks, and wherein storage areas of the plurality of solid state disks corresponding to at least some blocks of the plurality of blocks have different amounts of estimated life expectancies;

include in data structures associated with a block that is to be stored in the storage areas of the plurality of solid state disks, an indication that the block includes parity information corresponding to the RAID, wherein parity information comprises information corresponding to an error correction mechanism to protect against a disk failure; and send the data structures to the plurality of solid state disks, wherein the plurality of solid state disks allocate a storage area that is estimated to have a relatively greater life expectancy in comparison to other storage areas to store the block that includes the parity information, wherein the block is a first block and the data structures are first data structures, wherein second data structures associated with a second block contain an indication of how many data drives are present in the RAID, and wherein the second block is stored in an area of greater life expectancy than a third block in response to determining that the second block is for a greater number of data drives than the third block.

10. The computer program product of claim 9, wherein the first and the second data structures are included in a Small Computer Systems Interface (SCSI) command descriptor block (CDB), and wherein unused bits of the CDB are used to store the first and the second data structures.

11. The computer program product of claim 9, wherein the first and the second data structures are included in configuration registers of a Peripheral Component Interconnect (PCI) compliant card.

12. The computer program product of claim 9, wherein the storage area is a first storage area, wherein the indication is a first indication, the computer readable program code further configured to:

include in the second data structures associated with the second block that is to be stored in the storage areas of the solid state disks a second indication, wherein the second indication indicates a relative frequency with which the data stored in the second block is likely to be updated, wherein a second storage area that is estimated to have a relatively greater life expectancy in comparison to other storage areas is used to store the second block, wherein the second block has a higher relative frequency of updates in comparison to other blocks.

* * * * *